United States Patent
Yoon

(10) Patent No.: US 6,818,522 B2
(45) Date of Patent: Nov. 16, 2004

(54) METHOD FOR FORMING CAPACITOR OF SEMICONDUCTOR DEVICE WITH RUTIN AND RUTIO DIFFUSION BARRIER

(75) Inventor: Dong Soo Yoon, Kyoungki-do (KR)

(73) Assignee: Hynix Semiconductor Inc., Kyoungki-do (KR)

(*) Notice: Subject to any disclaimer, the term of this patent is extended or adjusted under 35 U.S.C. 154(b) by 52 days.

(21) Appl. No.: 10/315,425

(22) Filed: Dec. 10, 2002

(65) Prior Publication Data

US 2004/0110356 A1 Jun. 10, 2004

(30) Foreign Application Priority Data

Dec. 10, 2001 (KR) .................................... 2001-0077848

(51) Int. Cl.[7] .............................................. H01L 21/20
(52) U.S. Cl. ........................ 438/396; 438/399; 438/627
(58) Field of Search .......................... 257/296.306, 758; 438/253, 387, 396–399, 627

(56) References Cited

U.S. PATENT DOCUMENTS

| 6,348,709 B1 | 2/2002 | Graettinger et al. |
| 6,388,281 B1 | 5/2002 | Jung et al. |
| 2003/0040162 A1 * | 2/2003 | Cho et al. .................... 438/396 |
| 2003/0042609 A1 * | 3/2003 | Choi .......................... 257/758 |
| 2003/0047771 A1 * | 3/2003 | Kweon et al. .............. 257/306 |
| 2003/0057445 A1 * | 3/2003 | Kweon et al. .............. 257/200 |
| 2003/0094644 A1 * | 5/2003 | Yoon .......................... 257/296 |
| 2003/0094646 A1 * | 5/2003 | Yoon .......................... 257/306 |

* cited by examiner

Primary Examiner—David A. Zarneke
Assistant Examiner—Asok Kumar Sarkar
(74) Attorney, Agent, or Firm—Marshall, Gerstein & Borun LLP

(57) ABSTRACT

Methods for forming capacitors of semiconductor devices are disclosed, and more particularly, methods for forming capacitors which comprises a contact plug, a diffusion barrier film, a lower electrode formed of ruthenium, a dielectric film formed of high dielectric constant material and an upper electrode are disclosed, wherein the diffusion barrier film having strong chemical bond, amorphous structure without rapid diffusion path of oxygen and low electrical resistance prevents diffusion of oxygen atoms during a deposition process and thermal treatment of the dielectric film to improve operation of the capacitor and reliability of the device.

19 Claims, 1 Drawing Sheet

METHOD FOR FORMING CAPACITOR OF SEMICONDUCTOR DEVICE WITH RUTIN AND RUTIO DIFFUSION BARRIER

BACKGROUND

1. Technical Field

Methods for forming capacitors of semiconductor devices are disclosed, and more particularly, methods for forming capacitors are disclosed wherein the capacitors comprise a contact plug, a diffusion barrier film, a lower electrode formed of ruthenium (hereinafter, referred to as 'Ru'), a dielectric film formed of high dielectric constant material and an upper electrode, and wherein the diffusion barrier film prevents diffusion of oxygen atoms during a deposition process and thermal treatment of the dielectric film to reduce degradation of characteristics of the device.

2. Description of the Related Art

A conventional diffusion barrier film is composed of TiN, TiAlN, TiSiN or TaSiN. A lower electrode composed of Ru or platinum is formed on the diffusion barrier film. A dielectric film is formed on the lower electrode using high dielectric constant materials such as BST or tantalum oxide film.

Here, the deposition process of dielectric film having high dielectric constant is carried out under oxygen atmosphere using a high thermal treatment method. As a result, oxygen atoms diffuse into the lower electrode and oxidize the diffusion barrier film.

In addition, when the lower electrode is composed of Ru film, molecular structure of Tris(2,4-octanedionato) ruthenium which is a source material must be broken down to allow the deposition of Ru film. Here, oxygen used as a reaction gas penetrates into the Ru film and diffuses through the lower electrode during the subsequent thermal process, thereby oxidizing a diffusion barrier film under the lower electrode. The oxidized diffusion barrier film degrades electrical characteristics of device.

SUMMARY OF THE DISCLOSURE

Accordingly, methods for forming capacitors of semiconductor devices are disclosed wherein the capacitors comprise a diffusion barrier film having strong chemical bond, amorphous structure without rapid diffusion path of oxygen and low electrical resistance in order to prevent degradation of characteristics of device during the subsequent high temperatures thermal process.

In order to produce the above-described capacitors one disclosed method comprises:

(a) forming a diffusion barrier film, wherein the diffusion barrier film includes a RuTiN film or RuTiN/RuTiO stacked film on a contact plug for a capacitor;

(b) thermally processing the diffusion barrier film via RTP under $O_2$ gas atmosphere; and (c) sequentially forming a lower electrode, a dielectric film and an upper electrode on the diffusion barrier film.

It is preferable that the RuTiN/RuTiO stacked film further comprises a plurality of RuTiN/RuTiO stacked films.

It is preferable that the step of thermally processing the diffusion barrier film further comprises a step of making the surface of the diffusion barrier film dense using ionized gas.

It is preferable that the step of forming a diffusion barrier film comprises a CVD process for forming the RuTiN film having a thickness ranging from 200 to 1000 Å performed at a temperature ranging from 100 to 900° C.

It is preferable that the RuTiN film comprises Ru ranging from about 50 to about 90 atom %, Ti ranging from about 10 to about 50 atom % and N ranging from about 1 to about 80 atom %.

It is more preferable that the RuTiN film comprises Ru ranging from about 60 to about 90 atom %, Ti ranging from about 10 to about 40 atom % and N ranging from about 5 to about 40 atom %.

It is preferable that the step of forming a diffusion barrier film comprises a CVD process for forming the RuTiO film having a thickness ranging from 200 to 1000 Å performed at a temperature ranging from 100 to 900° C.

It is preferable that the RuTiO film of RuTiN/RuTiO stacked film comprises Ru ranging from about 50 to about 90 atom %, Ti ranging from about 10 to about 50 atom % and O ranging from about 1 to about 50 atom %.

It is preferable that the RuTiO film of RuTiN/RuTiO stacked film comprises Ru ranging from about 60 to about 90 atom %, Ti ranging from about 10 to about 40 atom % and O ranging from about 5 to about 40 atom %.

It is preferable that the step of forming the diffusion barrier film further comprises a purge process using a purge gas selected from the group consisting of $N_2$, He, Ne, Ar, $H_2$ and mixed gas thereof.

It is preferable that the step of forming the diffusion barrier film employs a Ru precursor selected from the group consisting of $RuX_2$ and $RuX_3$ (where, X is selected from the group consisting of H, F, Cl, Br, I, $C_1$–$C_{10}$ alkyl, $C_2$–$C_{10}$ alkenyl, $C_1$–$C_8$ alkoxy, $C_6$–$C_{12}$ aryl, $C_1$–$C_8$ alkylcyclopentadienyl, cyclopentadienyl, β-diketonates, $C_1$–$C_{10}$ alkyl substituted with halogen, $C_2$–$C_{10}$ alkenyl substituted with halogen, $C_1$–$C_8$ alkoxy substituted with halogen, $C_6$–$C_{12}$ aryl substituted with halogen, $C_1$–$C_8$ alkylcyclopentadienyl substituted with halogen, cyclopentadienyl substituted with halogen and β-diketonates substituted with halogen).

It is preferable that the Ru precursor comprises Bis (ethylcyclopentadienyl) ruthenium, Tris(2,4-octanedionato) ruthenium or Tris(6-methyl-2,4-heptanedionato) ruthenium.

It is preferable that the step of forming the diffusion barrier film employs a Ti precursor selected from the group consisting of $TiY_4$ and $TiY_2$ (where, Y is selected from the group consisting of H, F, Cl, Br, I, $C_1$–$C_{10}$ alkyl, $C_2$–$C_{10}$ alkenyl, $C_1$–$C_8$ alkoxy, $C_6$–$C_{12}$ aryl, $C_1$–$C_8$ alkylcyclopentadienyl, cyclopentadienyl, β-diketonates, $C_1$–$C_{10}$ alkyl substituted with halogen, $C_2$–$C_{10}$ alkenyl substituted with halogen, $C_1$–$C_8$ alkoxy substituted with halogen, $C_6$–$C_{12}$ aryl substituted with halogen, $C_1$–$C_8$ alkylcyclopentadienyl substituted with halogen, cyclopentadienyl substituted with halogen and β-diketonates substituted with halogen).

It is preferable that the Ti precursor comprises Titanium tetrachloride or Titanium tetraisopropoxide.

It is preferable that the diffusion barrier film is formed using a reaction gas selected from the group consisting of $O_2$, $NH_3$, $H_2O$, $H_2O_2$, ROH, RCOOH, $C_2$–$C_{10}$ diol and mixtures thereof (where, R is selected from the group consisting of H, $C_1$–$C_{10}$ alkyl, $C_2$–$C_{10}$ alkenyl, $C_1$–$C_8$ alkoxy, $C_6$–$C_{12}$ aryl, $C_1$–$C_{10}$ alkyl substituted with halogen, $C_2$–$C_{10}$ alkenyl substituted with halogen, $C_1$–$C_8$ alkoxy substituted with halogen and $C_6$–$C_{12}$ aryl substituted with halogen).

It is preferable that the thermally processing the step (b) is performed under a gas atmosphere selected from the group consisting of $O_2$ gas, mixture gas of Ar and $O_2$, mixture gas of $N_2$ and $O_2$ and combinations thereof.

It is preferable that the step of making the surface of the diffusion barrier film dense using ionized gas comprises (i) process comprising the steps of impacting the diffusion barrier film with ionized $O_2$, ionized Ar, ionized Ar and $O_2$, ionized $N_2$ and ionized $N_2$ and $O_2$; thermally treating the diffusion barrier film; and forming a uniform oxide layer on the surface of the diffusion barrier film using $O_2$ ion, (ii) process comprising the steps of thermally treating the diffusion barrier film under $NH_3$ gas atmosphere, $NH_3$ plasma or $NH_3/O_2$ plasma atmosphere; and forming a uniform oxide layer on the surface of the diffusion barrier film using $O_2$ ion, (iii) process comprising steps of thermally treating the diffusion barrier film using $UV-O_3$ to form a surface layer or (iv) combinations thereof.

It is preferable that the thermally processing the diffusion barrier film is performed at a temperature ranging from 100 to 650° C. for a time period ranging from 1 to 5 minutes.

It is preferable that the dielectric film is selected from the group consisting of a $Ta_2O_5$ film, a BST film, a PZT film, a SBT film, a BLT film and mixtures thereof.

A diffusion barrier film is formed that has an oxidation tolerance at high temperature under oxygen atmosphere, which prevents degradation of characteristic of device during the subsequent thermal process.

A diffusion barrier film is required to prevent diffusion of oxygen atoms and must be oxidation-resistant. In order to prevent diffusion of oxygen at high temperature, the diffusion barrier film has an amorphous structure because the crystallization generates grain boundary, which is a rapid diffusion path of oxygen. In addition, the diffusion barrier film must have strong chemical bonding between each constituent to prevent oxidation and maintain conductivity after reaction with oxygen.

Accordingly, a diffusion barrier film according to the present invention comprises Ru which is a quasi-precious metal, as matrix and has oxygen or nitrogen and a small amount of Ti which is a heat-resistant metal added thereto. So that the diffusion barrier film has an amorphous structure due to strong chemical bonding of oxygen or nitrogen and so that the amorphous structure is maintained even at high temperature due to Ti. Additionally, a conductive oxide film is obtained even after a reaction with oxygen due to Ru, thereby preventing degradation of electrical characteristic of device.

The reaction by which a RuTiN film and RuTiO film is formed as follows.

A RuTiN film is formed on a substrate heated at a temperature ranging from 100 to 900° C. using $RuX_2$ as Ru precursor, $TiY_4$ as Ti precursor and $NH_3$ as reaction gas, according to the first and the second reaction formulas:

$RuX_2$—$(NH_3)$→$Ru+2HX(\uparrow)$      first formula $TiY_4$—$(NH_3)$→$TiN+2HY(\uparrow)$      second formula.

The reaction gas $NH_3$ reacts with Ru precursor and Ti precursor according to the above reaction formulas to form Ru and TiN. As a result, a RuTiN film wherein Ru and TiN are irregularly deposited is formed. Here, HX and HY, which is strong volatile reaction products, are easily removed via a vacuum.

A RuTiO film is formed on a substrate heated at a temperature ranging from 100 to 900° C. using $RuX_2$ as Ru precursor, $TiY_4$ as Ti precursor and $O_2$ as reaction gas, according to the third and the fourth reaction formulas:

$RuX_2$—$(O_2)$→$RuO_x+2XO_2(\uparrow)$      third formula $TiY_4$—$(O_2)$→$TiO_x+4YO_2(\uparrow)$      fourth formula The reaction gas $O_2$ reacts with Ru precursor and Ti precursor according to the above reaction formulas to form $RuO_x$ and $TiO_x$. As a result, a RuTiO film wherein $RuO_x$ and $TiO_x$ are irregularly deposited is formed. Here, $XO_2$ and $YO_2$, which is strong volatile reaction products, are easily removed via a vacuum.

However, a RuTiN film and a RuTiO film may also be formed using other Ru precursor and Ti precursor.

A RuTiN film is formed on a substrate heated at a temperature ranging from 100 to 900° C. using $RuX_3$ as Ru precursor, $TiY_4$ as Ti precursor and $NH_3$ as reaction gas, according to the fifth and the sixth reaction formulas:

$RuX_3$—$(NH_3)$→$Ru+3HX(\uparrow)$      fifth formula $TiY_4$—$(NH_3)$→$TiN+HY(\uparrow)$      sixth formula The reaction gas $NH_3$ reacts with Ru precursor and Ti precursor according to the above reaction formulas to form Ru and TiN. As a result, a RuTiN film wherein Ru and TiN are irregularly deposited is formed. Here, HX and HY, which is strong volatile reaction products, are easily removed via a vacuum.

A RuTiO film is formed on a substrate heated at a temperature ranging from 100 to 900° C. using $RuX_3$ as Ru precursor, $TiY_4$ as Ti precursor and $O_2$ as reaction gas, according to the seventh and the eighth reaction formulas:

$RuX_3$—$(O_2)$→$RuO_x+3XO_2(\uparrow)$      seventh formula $TiY_2$—$(O_2)$→$TiO_x+2YO_2(\uparrow)$      eighth formula The reaction gas $O_2$ reacts with Ru precursor and Ti precursor according to the above reaction formulas to form $RuO_x$ and $TiO_x$. As a result, a RuTiO film wherein $RuO_x$ and $TiO_x$ are irregularly deposited is formed. Here, $XO_2$ and $YO_2$, which is strong volatile reaction products, are easily removed via a vacuum.

Here, the diffusion barrier film may be a RuTiN film, a RuTiN/RuTiO stacked film or a stacked structure of a plurality of RuTiN/RuTiO stacked films.

DETAILED DESCRIPTION OF THE PRESENTLY PREFERRED EMBODIMENTS

A method for forming a capacitor of a semiconductor device will be described in greater detail while referring to the accompanying drawings.

FIGS. 1a to 1d are cross-sectional diagrams illustrating a method for forming a capacitor of a semiconductor device in accordance with a preferred embodiment. The diagrams illustrates a diffusion barrier film formed on a polysilicon contact plug, and a capacitor comprising a lower electrode, a dielectric film and an upper electrode sequentially formed on the diffusion barrier film.

Figure 1A:
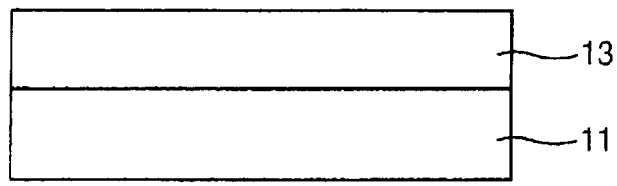
FIGS. 1a to 1d are cross-sectional diagrams illustrating a method for forming a capacitor of a semiconductor device in accordance with a preferred embodiment.

Referring to FIG. 1a, a diffusion barrier film 13 is formed on a contact plug 11. Here, the diffusion barrier film 13 comprises a RuTiN film, RuTiN/RuTiO stacked film or a stacked structure of a plurality of RuTiN/RuTiO stacked films. After formation of the diffusion barrier film 13, it is preferable that the surface thereof be made dense or impacted by oxygen.

The RuTiN film which is the diffusion barrier film 13 preferably has a thickness ranging from 200 to 1000 Å and is formed using a CVD method at a temperature ranging from 100 to 900° C. The RuTiN film comprises Ru ranging from about 50 to about 90 atom %, Ti ranging from about 10 to about 50 atom % and N ranging from about 1 to about 80 atom %, more preferably RU ranging from about 60 to about 90 atom %, Ti ranging from about 10 to about 40 atom % and N ranging from about 5 to about 40 atom %.

Specifically, the RuTiN film is formed on a substrate heated at a temperature ranging from 100 to 900° C. using $RuX_2$ as Ru precursor, $TiY_4$ as Ti precursor and $NH_3$ as reaction gas, according to the above-described first and the second reaction formulas.

The reaction gas $NH_3$ reacts with Ru precursor and Ti precursor to form Ru and TiN and the RuTiN film wherein Ru and TiN are irregularly deposited is formed. Here, HX and HY, which is strong volatile reaction products, are easily removed via vacuum.

The RuTiO film which is the diffusion barrier film 13 preferably has a thickness ranging from 200 to 1000 Å and is fanned using a CVD method at a temperature ranging from 100 to 900° C. The RuTiO film of RuTiN/RuTiO stacked film comprises Ru ranging from about 50 to about 90 atom %, Ti ranging from about 10 to about 50 atom % and 0 ranging from about 1 to about 50 atom %, more preferably Ru ranging from about 60 to about 90 atom %, Ti ranging from about 10 to about 40 atom % and O ranging from about 5 to about 40 atom %.

Specifically, the RuTiO film is formed on a substrate heated at a temperature ranging from 100 to 900° C. using $RuX_2$ as Ru precursor, $TiY_4$ as Ti precursor and $O_2$ as reaction gas, according to the third and the fourth reaction formulas.

The reaction gas $O_2$ reacts with Ru precursor and Ti precursor to form $RuO_x$ and $TiO_x$ and the RuTiO film wherein $RuO_x$ and $TiO_x$ are irregularly deposited is formed. Here, $XO_2$ and $YO_2$, which is strong volatile reaction products, are easily removed via vacuum.

For $RuX_2$ which is a Ru precursor, X is selected from the group consisting of H, F, Cl, Br, I, $C_1$–$C_{10}$ alkyl, $C_2$–$C_{10}$ alkenyl, $C_1$–$C_8$ alkoxy, $C_6$–$C_{12}$ aryl, $C_1$–$C_8$ alkylcyclopentadienyl, cyclopentadienyl, β-diketonates, $C_1$–$C_{10}$ alkyl substituted with halogen, $C_2$–$C_{10}$ alkenyl substituted with halogen, $C_1$–$C_8$ alkoxy substituted with halogen, $C_6$–$C_{12}$ aryl substituted with halogen, $C_1$–$C_8$ alkylcyclopentadienyl substituted with halogen, cyclopentadienyl substituted with halogen and β-diketonates substituted with halogen. Specifically, Bis(ethylcyclopentadienyl)ruthenium, Tris(2,4-octanedionato)ruthenium or Tris(6-methyl-2,4-heptanedionato)ruthenium is used for the Ru precursor.

For $TiY_4$ which is a Ti precursor, Y is selected from the group consisting of H, F, Cl, Br, I, $C_1$–$C_{10}$ alkyl, $C_2$–$C_{10}$ alkenyl, $C_1$–$C_8$ alkoxy, $C_6$–$C_{12}$ aryl, $C_1$–$C_8$ alkylcyclopentadienyl, cyclopentadienyl, β-diketonates, $C_1$–$C_{10}$ alkyl substituted with halogen, $C_2$–$C_{10}$ alkenyl substituted with halogen, $C_1$–$C_8$ alkoxy substituted with halogen, $C_6$–$C_{12}$ aryl substituted with halogen, $C_1$–$C_8$ alkylcyclopentadienyl substituted with halogen, cyclopentadienyl substituted with halogen and β-diketonates substituted with halogen. Specifically, Titanium tetrachloride or Titanium tetraisopropoxide is used for the Ti precursor.

Preferably, the reaction gas used during the deposition process of the diffusion barrier film 13 is selected from the group consisting of $H_2O$, $H_2O_2$, ROH, RCOOH, $C_2$–$C_{10}$ diol or mixtures thereof instead of the above-described $O_2$ and $NH_3$.

Preferably, the R is selected from the group consisting of H, $C_1$–$C_{10}$ alkyl, $C_2$–$C_{10}$ alkenyl, $C_1$–$C_8$ alkoxy, $C_6$–$C_{12}$ aryl, $C_1$–$C_{10}$ alkyl substituted with halogen, $C_2$–$C_{10}$ alkenyl substituted with halogen, $C_1$–$C_8$ alkoxy substituted with halogen, $C_6$–$C_{12}$ aryl substituted with halogen.

The deposition process of the diffusion barrier film 13 is accompanied by a purge process using a purge gas selected from the group consisting of $N_2$, He, Ne, Ar, $H_2$ or mixtures thereof.

A method for making the surface of the RuTiN film or the RuTiO film dense or impacted by oxygen is described as follows.

First, a method for impacting the surface of the RuTiN film or the RuTiO film with oxygen includes:

a) thermally processing a RuTiN film or RuTiO film via RTP at a temperature ranging from 100 to 650° C. under $O_2$ atmosphere for a time period ranging from 1 to 5 minutes;

b) thermally processing a RuTiN film or RuTiO film via RTP at a temperature ranging from 100 to 650° C. under mixed gas atmosphere of Ar and $O_2$ for a time period ranging from 1 to 5 minutes with the amount of Ar and $O_2$ being varied;

c) thermally processing a RuTiN film or RuTiO film via RTP at a temperature ranging from 100 to 650° C. under mixed gas atmosphere $N_2$ and $O_2$ for a period of time ranging from 1 to 5 minutes with the amount of $N_2$ and $O_2$ being varied; and d) combinations thereof.

Additionally, methods for making the surface of the RuTiN film or RuTiO film dense and impacted by oxygen comprise:

a) impacting a RuTiN film or a RuTiO film with ionized $O_2$ to make the films dense, thermally processing the films at a temperature ranging from 100 to 650° C. for 1 to 5 minutes and then forming a uniform oxide layer using $O_2$ ion;

b) impacting a RuTiN film or a RuTiO film with ionized Ar to make the films dense, thermally processing the films at a temperature ranging from 100 to 650° C. for a time period ranging from 1 to 5 minutes and then forming a uniform oxide layer using $O_2$ ion;

c) impacting a RuTiN film or a RuTiO film with ionized Ar and $O_2$ to make the films dense, thermally processing the films at a temperature ranging from 100 to 650° C. for a time period ranging from 1 to 5 minutes and then forming a uniform oxide layer using $O_2$ ion;

d) impacting a RuTiN film or a RuTiO film with ionized $N_2$ to make the films dense, thermally processing the films at a temperature ranging from 100 to 650° C. for a time period ranging from 1 to 5 minutes and then forming a uniform oxide layer using $O_2$ ion;

e) impacting a RuTiN film or a RuTiO film with ionized $N_2$ and $O_2$ to make the films dense, thermally processing the films at a temperature ranging from 100 to 650° C. for a time period ranging from 1 to 5 minutes and then forming a uniform oxide layer using $O_2$ ion;

f) thermally processing a RuTiN film or a RuTiO film at a temperature ranging from 100 to 650° C. under $NH_3$ gas atmosphere for a time period ranging from 1 to 5 minutes and then forming a uniform oxide layer using $O_2$ ion;

g) thermally processing a RuTiN film or a RuTiO film at a temperature ranging from 100 to 650° C. under $NH_3$ plasma atmosphere for a time period ranging from 1 to 5 minutes and then forming a uniform oxide layer using $O_2$ ion;

h) thermally processing a RuTiN film or a RuTiO film at a temperature ranging from 100 to 650° C. under $NH_3/O_2$ plasma atmosphere for a time period ranging from 1 to 5 minutes and then forming a uniform oxide layer using $O_2$ ion;

i) thermally processing a RuTiN film or a RuTiO film at a temperature ranging from 100 to 650° C. for a time period ranging from 1 to 5 minutes using $UV-O_3$; and j) combinations thereof.

Figure 1B:
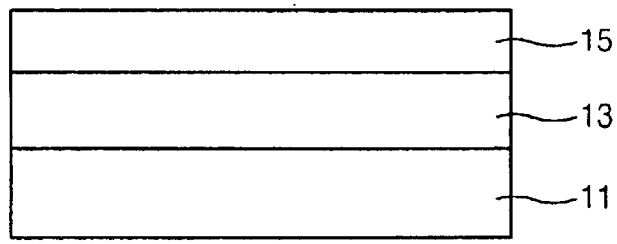

Referring to FIG. 1b, a lower electrode 15 is formed by depositing a Ru film on the diffusion barrier film 13.

Figure 1C:
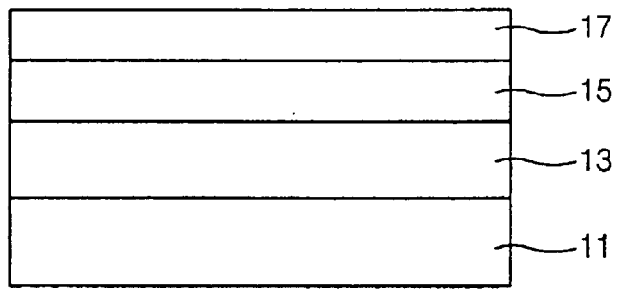

Referring to FIG. 1c, a dielectric film 17 having high dielectric constant is formed on the lower electrode 15. Here, the dielectric film 17 is selected from the group consisting of a $Ta_2O_5$ film, a BST film, a PZT film, a SBT film, a BLT film and mixtures thereof.

Figure 1D:
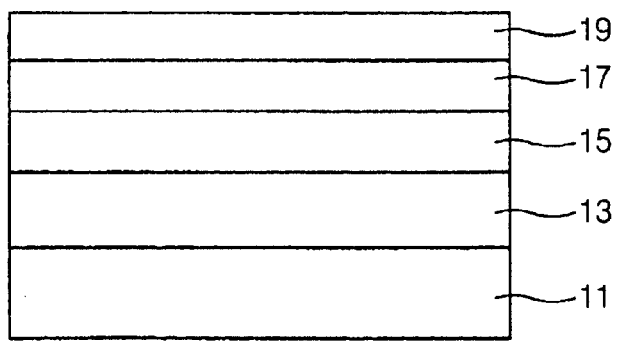

Referring to FIG. 1d, an upper electrode 19 is formed on the dielectric film 17 by depositing a TiN film or a Ru film.

In another preferred embodiment of the present invention, the RuTiN film is formed on a substrate heated at a temperature ranging from 100 to 900° C. using $RuX_3$ as Ru precursor, $TiY_4$ as Ti precursor and $NH_3$ as reaction gas, according to the fifth and the sixth reaction formulas.

The reaction gas $NH_3$ reacts with Ru precursor and Ti precursor to form Ru and TiN and the RuTiN film wherein Ru and TiN are irregularly deposited is formed. Here, HX and HY, which is strong volatile reaction products, are easily removed via vacuum.

For $RuX_3$ which is a Ru precursor, X is as described above.

Additionally, the RuTiO film is formed on a substrate heated at a temperature ranging from 100 to 900° C. using $RuX_3$ as Ru precusor, $TiY_4$ as Ti precursor and $O_2$ as reaction gas, according to the seventh and the eighth reaction formulas.

The reaction gas $O_2$ reacts with Ru precursor and Ti precursor to form $RuO_x$ and $TiO_x$ and the RuTiO film wherein $RuO_x$ and $TiO_x$ are irregularly deposited is formed. Here, $XO_2$ and $YO_2$, which is strong volatile reaction products, are easily removed via vacuum.

For $TiY_2$ which is a Ti precursor, Y is as described above.

As discussed earlier, in the disclosed methods, diffusion of oxygen is effectively prevented during the deposition process and thermal process of a dielectric film having high dielectric constant, thereby preventing degradation of characteristic of device and improving characteristics of DRAM and FeRAM for high integration of the produced semiconductor devices.

What is claimed is:

1. A method for forming a capacitor of a semiconductor device comprising:

(a) forming a diffusion barrier film, wherein the diffusion barrier film includes a RuTiN film or RuTiN/RuTiO stacked film on a contact plug for a capacitor;

(b) thermally processing the diffusion barrier film via RTP under $O_2$ gas atmosphere; and (c) sequentially forming a lower electrode, a dielectric film and an upper electrode on the diffusion barrier film.

2. The method according to claim 1, wherein the RuTiN/RuTiO stacked film further comprises a plurality of RuTiN/RuTiO stacked films.

3. The method according to claim 1, wherein the step of thermally processing the diffusion barrier film further comprises a step of making the surface of the diffusion barrier film dense using ionized gas.

4. The method according to claim 3, wherein the step of making the surface of the diffusion barrier film dense using ionized gas comprises (i) process comprising the steps of impacting the diffusion barrier film with ionized $O_2$, ionized Ar, ionized Ar and $O_2$, ionized $N_2$ and ionized $N_2$ and $O_2$; thermally treating the diffusion barrier film; and forming a uniform oxide layer on the surface of the diffusion barrier film using $O_2$ ion, (ii) process comprising the steps of thermally treating the diffusion barrier film under $NH_3$ gas atmosphere, $NH_3$ plasma or $NH_3/O_2$ plasma atmosphere; and forming a uniform oxide layer on the surface of the diffusion barrier film using $O_2$ ion, (iii) process comprising steps of thermally treating the diffusion barrier film using $UV-O_3$ to form a surface layer or (iv) combinations thereof.

5. The method according to claim 1, wherein the step of forming a diffusion barrier film comprises a CVD process for forming the RuTiN film having a thickness ranging from 200 to 1000 Å performed at a temperature ranging from 100 to 900° C.

6. The method according to claim 1, wherein the RuTiN film comprises Ru ranging from about 50 to about 90 atom %, Ti ranging from about 10 to about 5.0 atom % and N ranging from about 1 to about 80 atom %.

7. The method according to claim 6, wherein the RuTiN film comprises Ru ranging from about 60 to about 90 atom %, Ti ranging from about 10 to about 40 atom % and N ranging from about 5 to about 40 atom %.

8. The method according to claim 1, wherein the step of forming a diffusion barrier film comprises a CVD process for forming the RuTiO film having a thickness ranging from 200 to 1000 Å performed at a temperature ranging from 100 to 900° C.

9. The method according to claim 1, wherein the RuTiO film of RuTiN/RuTiO stacked film comprises Ru ranging from about 50 to about 90 atom %, Ti ranging from about 10 to about 50 atom % and O ranging from about 1 to about 50 atom %.

10. The method according to claim 9, wherein the RuTiO film of RuTiN/RuTiO stacked film comprises Ru ranging from about 60 to about 90 atom %, Ti ranging from about 10 to about 40 atom % and O ranging from about 5 to about 40 atom %.

11. The method according to claim 1, wherein the step of forming the diffusion barrier film further comprises a purge process using a purge gas selected from the group consisting of $N_2$, He, Ne, Ar, $H_2$ and mixed gas thereof.

12. The method according to claim 1, wherein the step of forming the diffusion barrier film employs a Ru precursor selected from the group consisting of $RuX_2$ and $RuX_3$ (where, X is selected from the group consisting of H, F, Cl, Br, I, $C_1$–$C_{10}$ alkyl, $C_2$–$C_{10}$ alkenyl, $C_1$–$G_8$ alkoxy, $C_6$–$C_{12}$ aryl, $C_1$–$C_8$ alkylcyclopentadienyl, cyclopentadienyl, β-diketonates, $C_1$–$C_{10}$ alkyl substituted with halogen, $C_2$–$C_{10}$ alkenyl substituted with halogen, $C_1$–$C_8$ alkoxy substituted with halogen, $C_6$–$C_{12}$ aryl substituted with halogen, $C_1$–$C_8$ alkylcyclopentadienyl substituted with halogen, cyclopentadienyl substituted with halogen and β-diketonates substituted with halogen).

13. The method according to claim 12, wherein the Ru precursor comprises Bis(ethylcyclopentadienyl)ruthenium, Tris(2,4-octanedionato)ruthenium or Tris(6-methyl-2,4-heptanedionato)ruthenium.

14. The method according to claim 12, wherein the Ti precursor comprises Titanium tetrachloride or Titanium tetraisopropoxide.

15. The method according to claim 1, wherein the step of forming the diffusion barrier film employs a Ti precursor selected from the group consisting of $TiY_4$ and $TiY_2$ (where, Y is selected from the group consisting of H, F, Cl, Br, I, $C_1$–$C_{10}$ alkyl, $C_2$–$C_{10}$ alkenyl, $C_1$–$C_8$ alkoxy, $C_6$–$C_{12}$ aryl, $C_1$–$C_8$ alkylcyclopentadienyl, cyclopentadienyl, β-diketonates, $C_1$–$C_{10}$ alkyl substituted with halogen, $C_2$–$C_{10}$ alkenyl substituted with halogen, $C_1$–$C_8$ alkoxy substituted with halogen, $C_6$–$C_{12}$ aryl substituted with halogen, $C_1$–$C_8$ alkyicyclopentadienyl substituted with halogen, cyclopentadienyl substituted with halogen and β-diketonates substituted with halogen).

16. The method according to claim 1, wherein the step of forming the diffusion barrier film employs a reaction gas selected from the group consisting of $O_2$, $NH_3$, $H_2O$, $H_2O_2$, ROH, RCOOH, $C_2$–$C_{10}$ diol and mixed gas thereof (where, R is selected from the group consisting of H, $C_1$–$C_{10}$ alkyl, $C_2$–$C_{10}$ alkenyl, $C_1$–$C_8$ alkoxy, $C_6$–$C_{12}$ aryl, $C_1$–$C_{10}$ alkyl substituted with halogen, $C_2$–$C_{10}$ alkenyl substituted with halogen, $C_1$–$C_8$ alkoxy substituted with halogen and $C_6$–$C_{12}$ aryl substituted with halogen).

17. The method according to claim 1, wherein the step (b) is performed under a gas atmosphere selected from the group consisting of $O_2$ gas, mixture gas of Ar and $O_2$, mixture gas of $N_2$ and $O_2$ and combinations thereof.

18. The method according to any one of claims 17 and 4, wherein the thermally processing the diffusion barrier film is performed at a temperature ranging from 100 to 650° C. for a time period ranging from 1 to 5 minutes.

19. The method according to claim 1, wherein the dielectric film is selected from the group consisting of a $Ta_2O_5$ film, a BST film, a PZT film, a SBT film, a BLT film and combinations thereof.

* * * * *

UNITED STATES PATENT AND TRADEMARK OFFICE
CERTIFICATE OF CORRECTION

PATENT NO. : 6,818,522 B2
DATED : November 16, 2004
INVENTOR(S) : Dong-Soo Yoon

It is certified that error appears in the above-identified patent and that said Letters Patent is hereby corrected as shown below:

Title page,
Item [*] Notice, please insert -- This patent is subject to a Terminal Disclaimer --.

Column 8,
Line 24, after "from about 10 to about," please delete "5.0" and insert -- 50 -- in its place.

Column 9,
Line 10, after "$C_1$-$C_8$" please delete "alkyicyclopentadienyl" and insert -- alkylcyclopentadienyl -- in its place.

Signed and Sealed this

Tenth Day of May, 2005

JON W. DUDAS
*Director of the United States Patent and Trademark Office*